United States Patent [19]

Opaskar et al.

[11] Patent Number: 4,662,999

[45] Date of Patent: May 5, 1987

[54] PLATING BATH AND METHOD FOR ELECTROPLATING TIN AND/OR LEAD

[75] Inventors: Vincent C. Opaskar, Cleveland Heights; George S. Bokisa, Brookpark, both of Ohio

[73] Assignee: McGean-Rohco, Inc., Cleveland, Ohio

[21] Appl. No.: 826,849

[22] Filed: Feb. 6, 1986

Related U.S. Application Data

[63] Continuation-in-part of Ser. No. 749,176, Jun. 26, 1985, abandoned.

[51] Int. Cl.[4] .......................... C25D 3/32; C25D 3/36; C25D 3/56; C25D 3/60
[52] U.S. Cl. ..................................... 204/44.4; 204/53; 204/54.1
[58] Field of Search ................. 204/44.4, 53, 54 R, 204/123, 114, 120

[56] References Cited

U.S. PATENT DOCUMENTS

| | | | |
|---|---|---|---|
| 4,000,047 | 12/1976 | Ostrow et al. | 204/44.4 |
| 4,132,610 | 1/1979 | Dohi et al. | 204/44.4 |
| 4,459,185 | 7/1984 | Obata et al. | 204/44.4 |
| 4,565,609 | 1/1986 | Nobel et al. | 204/44.4 |
| 4,582,576 | 4/1986 | Opaskar et al. | 204/44.4 |

*Primary Examiner*—G. L. Kaplan
*Attorney, Agent, or Firm*—Renner, Otto, Boisselle & Lyon

[57] ABSTRACT

An aqueous acidic plating bath for electrodeposition of tin, lead or tin-lead alloys on a substrate is described. The plating baths are free of fluoride and fluoborate ions and comprise (A) at least one bath-soluble metal salt selected from the group consisting of a stannous salt, a lead salt, or a mixture of stannous and lead salts, (B) at least one alkane sulfonic acid or alkanolsulfonic acid, (C) at least one surfactant, (D) an effective amount of at least one primary brightening agent selected from the group consisting of halogen substituted and dialkoxy and trialkoxy substituted benzaldehydes, (E) an effective amount of a secondary brightening agent which is at least one lower aliphatic aldehyde, and (F) an effective amount of an auxiliary brightening agent which is at least one of the group consisting of aniline and the amino-, carboxy-, halo-, alkyl- or alkoxy-substituted anilines. Methods for the electrodeposition of tin, lead, or tin-lead alloys from such baths also are described.

35 Claims, No Drawings

PLATING BATH AND METHOD FOR ELECTROPLATING TIN AND/OR LEAD

This application is a continuation-in-part of copending U.S. patent application Ser. No. 749,176, filed June 26, 1985, and now abandoned, which is incorporated herein by reference.

BACKGROUND OF THE INVENTION

This invention relates to the electrodeposition of tin, lead, and tin-lead alloys, and particularly to a plating bath which is free of fluoride and fluoborates and which deposits smooth, level and bright tin and/or lead coatings.

Aqueous acidic plating baths for depositing tin and/or lead coatings on substrates have been known in the art, and most of these baths contain, in addition to the water-soluble tin and/or lead salts, fluoborates, fluosilicates, sulfates, sulfamates, etc. Plating baths containing fluoborate have been used widely to permit high-speed, uniform metal plating of tin, lead or tin-lead alloys. However, baths containing fluoborates generally are quite corrosive and toxic, requiring special equipment which is expensive and presents difficulties in operation, including the disposal of waste water.

In addition to the basic ingredients, the prior art has suggested improvements in tin and/or lead plating baths by including additives which will improve on the brightness of the deposit obtained from such baths. For example, in U.S. Pat. No. 3,875,029, the use of naphthalene monocarboxaldehyde either alone or in combination with certain substituted olefins described in the patent results in an improvement in the brightness of the deposit. Other ingredients which have been suggested as being useful additives in tin and/or lead plating baths include various combinations of aldehydes, ketones, nonionic surfactants, and amines. The plating bath described in U.S. Pat. No. 3,785,939 for producing bright deposits of tin-lead alloys comprises a combination of a nonionic polyoxyalkylated surfactant, a lower aliphatic aldehyde, an aromatic aldehyde, and an amine.

More recently, plating bath formulations have been suggested which provide for the deposition of tin and/or lead coatings wherein the baths contain no fluoborates. For example, U.S. Pat. No. 4,459,185 describes a plating bath which is prepared by adding one or more specified cationic, amphoteric and/or nonionic surfactants and one or more leveling agents to a principal plating bath which contains an alkane sulfonic or alkanol sulfonic acid and either a divalent tin salt or a divalent lead salt of the sulfonic acids or a mixture of these. The patentees suggest that the performance of such plating baths is comparable or even superior to plating baths containing borofluoride. The plating baths contain certain specified surfactants which may be cationic surfactants, amphoteric surfactants, or nonionic surfactants. The smoothness of the coating is improved by the synergistic effect obtained by the combination of the specified surfactants and certain leveling agents. A variety of leveling agents including benzaldehyde derivatives are described in the patent.

Tin-lead alloy plating baths including hydroxyalkyl sulfonic acids are described in U.S. Pat. No. 4,132,610. The baths do not contain fluoborates or phenol sulfonates, but do contain the reaction product of o-toluidine with acetaldehyde as a brightener.

U.S. Pat. No. 3,905,878 describes tin-lead plating baths containing at least one sulfonate salt of tin and lead as well as free phenolsulfonic acid and/or free cresolsulfonic acid. Additionally, the plating baths contain a brightening agent which is prepared by reacting an aliphatic aldehyde with an aromatic primary amine under alkaline conditions. The plating baths also contain acetaldehyde and, optionally, surface active agents.

The use of olefinic compounds as brighteners in tin and tin-lead alloy plating baths, salts of fluoboric acid or sulfuric acid, is described in U.S. Pat. No. 3,875,029. The olefinic compounds useful as brighteners are characterized by the general formula

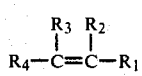

where $R_1$ is carboxy, carboxamide, alkali carboxylate, ammonium carboxylate, amine carboxylate, or alkyl carboxylate, and $R_2$, $R_3$ and $R_4$ are hydrogen, methyl, or lower alkyl. Such olefins are utilized in combination with a naphthalene monocarboxaldehyde.

U.S. Pat. No. 774,049 describes a process for electrolytically depositing lead peroxide on lead plates. The baths include a sulfonic acid or oxysulfonic acid derivative of methane and its hydroxy-substituted derivatives such as methyl sulfonic acid, methylene disulfonic acid, oxymethylene disulfonic acid, etc.

U.S. Pat. No. 4,072,582 describes tin plating baths containing dialkoxy benzaldehydes, emulsifying agents and alpha, beta unsaturated carboxylic acids, amides and esters for producing bright tin deposits. The tin is introduced into the bath as stannous sulfate, and sulfuric acid is included in the baths.

Tin or tin and lead plating baths containing aromatic sulfones and mono- and poly-sulfonic acids of benzene, phenol and cresol are described in U.S. Pat. No. 2,313,371 and British Pat. No. 555,929. The aromatic sulfonic acids form soluble salts of tin and lead, and the disulfonic acids are particularly preferred because they provide extremely soluble salts.

U.S. Pat. No. 3,984,291 describes a plating bath which does not contain any fluoride or fluoborate. These plating baths are based on pyrophosphate and Rochelle salts. The bath is prepared, for example, by dissolving stannous pyrophosphate, potassium pyrophosphate and Rochelle salts (NaK tartrate) together with a lead salt such as lead tartrate or lead pyrophosphate in water. Generally, these types of electrolytic baths are operated at a pH of from 8.0 to 10.

Electroplating baths containing an alkane sulfonate ion wherein the alkyl group contains between 1 and 5 carbon atoms are described in U.S. Pat. No. 2,525,942. The sulfonate ions are the principal or sole anions in the plating bath. The metallic ions contained in the electrochemical baths may be lead, nickel, chromium, copper, zinc, iron, cobalt, cadmium and silver. The baths are described as being especially suitable for the electroplating of lead and nickel.

SUMMARY OF THE INVENTION

It now have been found that a smooth, level and bright deposit of tin, lead or tin-lead alloy can be deposited on a substrate from an aqueous plating bath which contains no fluoride or fluoborates. Preferably the plating baths also are free of strong inorganic acids such as sulfuric acid. The aqueous plating baths of the invention comprise (A) at least one bath-soluble metal salt selected from the group consisting of a stannous salt, a lead salt, or a mixture of stannous and lead salts, (B) at least one alkane sulfonic acid or alkanolsulfonic acid, (C) at least one surfactant, (D) an effective amount of at least one primary brightening agent selected from the group consisting of halo-, dialkoxy- and trialkoxy-substituted benzaldehydes wherein each alkoxy group independently contains from one to about four carbon atoms, (E) an effective amount of a secondary brightening agent which is at least one lower aliphatic aldehyde, and optionally (F) an effective amount of an auxiliary brightening agent which is at least one of the group consisting of aniline and the halo-, alkyl-, alkoxy-, amino, or carboxy-substituted anilines.

DESCRIPTION OF THE PREFERRED EMBODIMENTS

The plating baths of the present invention comprise tin ion, lead ions, or a mixture of tin and lead ions, at least one alkane sulfonic acid or alkanol sulfonic acid, at least one surfactant, at least one primary brightening agent which is halo-, dialkoxy- or trialkoxy-substituted benzaldehyde and at least one secondary brightening agent. Generally, the plating baths of the present invention will comprise a mixture of the free sulfonic acid with the tin, lead, or a mixture of tin and lead salts of the sulfonic acids, which salts are soluble in the plating baths.

The alkane sulfonic acids (B) that can be utilized in the present invention have the following formula $$RSO_3H \quad (I)$$

wherein R is an alkyl group containing from about 1 to about 12 carbon atoms and more preferably, from about 1 to 6 carbon atoms. Examples of such alkane sulfonic acids include, for example, methane sulfonic acid, ethane sulfonic acid, propane sulfonic acid, 2-propane sulfonic acid, butane sulfonic acid, 2-butane sulfonic acid, pentane sulfonic acid, hexane sulfonic acid, decane sulfonic acid and dodecane sulfonic acid. The individual alkane sulfonic acids or mixtures of any of the above alkane sulfonic acids can be utilized in the plating baths of the invention.

The alkanol sulfonic acids (B) which are useful in the present invention are characterized by the following formula

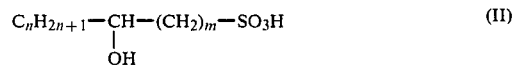

$$C_nH_{2n+1}-\underset{\underset{OH}{|}}{CH}-(CH_2)_m-SO_3H \quad (II)$$

wherein n is from 0 to about 10, m is from 1 to about 11 and the sum of m+n is up to about 12. As can be seen from the above formula II, the hydroxy group may be a terminal or internal hydroxy group. Examples of useful alkanol sulfonic acids include 2-hydroxy ethyl-1-sulfonic acid, 1-hydroxy propyl-2-sulfonic acid, 2-hydroxy propyl-1-sulfonic acid, 3-hydroxy propyl-1-sulfonic acid, 2-hydroxy butyl-1-sulfonic acid, 4-hydroxy butyl-1-sulfonic acid, 2-hydroxy-pentyl-1-sulfonic acid, 4-hydroxy-pentyl-1-sulfonic acid, 2-hydroxy-hexyl-1-sulfonic acid, 2-hydroxy decyl-1-sulfonic acid, 2-hydroxy dodecyl-1-sulfonic acid.

The alkane sulfonic acids and alkanol sulfonic acids are available commercially and can also be prepared by a variety of methods known in the art. One method comprises the catalytic oxidation of mercaptans or aliphatic sulfides having the formula $R_1S_nR_2$ wherein $R_1$ or $R_2$ are alkyl groups and n is a positive integer between 1 and 6. Air or oxygen may be used as the oxidizing agent, and various nitrogen oxides can be employed as catalysts. The oxidation generally is effected at temperatures below about 150° C. Such oxidation processes are described and claimed in U.S. Pat. No. 2,433,395 and 2,433,396. Alternatively, chlorine can be used as the oxidizing agent.

When the plating bath is to be a tin plating bath, the bath will contain at least one alkane or alkanol sulfonic acid as described above and a tin salt thereof. Likewise, a lead plating bath contains at least one alkane or alkanol sulfonic acid and a lead salt thereof. Mixtures of said acids and salts are useful. The tin-lead alloy plating baths will contain at least one alkane or alkanol sulfonic acid and the tin and lead salts thereof. The divalent tin and divalent lead salts of alkane sulfonic acids and alkanol sulfonic acids can be readily prepared by the reaction of a divalent tin or divalent lead salt with the desired sulfonic acid. Examples of tin and lead salts which can be reacted with the sulfonic acid to form the desired metal sulfonate include the oxides of tin and lead.

The total concentration of metal ion or ions in the bath may vary over a wide range depending upon the desired properties of the plating to be deposited on the substrate. Generally, from about 0.5 to about 350 grams per liter or more of the metal ion or ions is included in the bath, and more generally, the bath will contain from about 6 to about 100 grams per liter of metal ion or ions. Obviously, when a tin deposit is desired, the lead ion is omitted from the bath, and, conversely, when a lead deposit is desired, the tin ion is omitted from the bath.

The concentration of the free alkane or alkanol sulfonic acid (b) in the plating baths of the invention is in a range of from about 10 to about 500 grams per liter of bath, and more preferably from about 50 to about 200 grams per liter of bath.

In addition to the above components, it is necessary that the plating baths of the invention contain (C) at least one surfactant including nonionic, cationic, anionic or amphoteric surfactants. A variety of nonionic surfactants which can be utilized in the present invention are the condensation products of ethylene oxide and/or propylene oxide with compounds containing a hydroxy, mercapto or amino group containing at least one N—H. Examples of materials containing hydroxyl groups include alkyl phenols, styrenated phenols, fatty alcohols, fatty acids, polyalkylene glycols, etc. Examples of materials containing amino groups include alkylamines and polyamines, fatty acid amides, etc.

Examples of nonionic surfactants useful in the plating baths of the invention include ether containing surfactants having the formula

$$R-O-[(CH_2)_nO]_xH \quad (A)$$

wherein R is an aryl or alkyl group containing from about 6 to 20 carbon atoms, n is two or three, and x is an integer between 2 and 100. Such surfactants are produced generally by treating fatty alcohols or alkyl or alkoxy substituted phenols or naphthols with excess ethylene oxide or propylene oxide. The alkyl carbon chain may contain from about 14 to 24 carbon atoms and may be derived from a long chain fatty alcohol such as oleyl alcohol or stearyl alcohol.

Nonionic polyoxyethylene compounds of this type are described in U.S. Pat. No. 3,855,085. Such polyoxyethylene compounds are available commercially under the general trade designations "Surfynol" by Air Products and Chemicals, Inc. of Wayne, Pa, and under the designation "Pluronic" or "Tetronic" by BASF Wyandotte Corp. of Wyandotte, Mich. Examples of specific polyoxyethylene condensation products useful in the invention include "Surfynol 465" which is a product obtained by reacting about 10 moles of ethylene oxide with 1 mole of tetramethyldecynediol. "Surfynol 485" is the product obtained by reacting 30 moles of ethylene oxide with tetramethyldecynediol. "Pluronic L 35" is a product obtained by reacting 22 moles of ethylene oxide with polypropylene glycol obtained by the condensation of 16 moles of propylene oxide.

Alkoxylated amine, long chain fatty amine, long chain fatty acid, alkanol amines, diamines, amides, alkanol amides and polyglycol-type surfactants known in the art are also useful. One type of amine surfactant found particularly useful in a tin or lead plating bath is the group obtained by the addition of a mixture of propylene oxide and ethylene oxide to diamines. More specifically, compounds formed by the addition of propylene oxide to ethylene diamine followed by the addition of ethylene oxide are useful and are available commercially from BASF Wyandotte, Ind. Chemical Group under the general trade designation "Tetronic".

Carbowax-type surfactants which are polyethylene glycols having different molecular weights also are useful. For example Carbowax No. 1000 has a molecular weight range of from about 950 to 1,050 and contains from 20 to 24 ethoxy units per molecule. Carbowax No. 4000 has a molecular weight range of from about 3000 to 3700 and contains from 68 to 85 ethoxy units per molecule. Other known nonionic glycol derivatives such as polyalkylene glycol ethers and methoxy polyethylene glycols which are available commercially can be utilized as surfactants in the compositions of the invention.

Ethylene oxide condensation products with fatty acids also are useful non-ionic surfactants. Many of these are available commercially such as under the general tradename "Ethofat" from Armak Ind. Examples include condensate of coco acids, oleic acid, etc. Ethylene oxide condensates of fatty acid amides, e.g. oleamide, also are available from Armak Ind.

In some of the baths, improved results are obtained when polyoxyalkylated glycols, phenols and/or naphthols are included. For example ethylene oxide and propylene oxide condensates with aliphatic alcohols, sorbitan alkyl esters, alkyl, alkoxy and styrenated phenols and naphthols are useful additives. About 6 to about 40 moles of the oxide may be condensed with the above identified compound. Many of these condensates are available commercially under such trade names as "Tween" from ICI America, "Triton" from Rohm & Haas Co., "Tergitol" from Union Carbide, and "Igepal" from General Aniline and Film Corp.

The surfactants (C) utilized in the plating baths of the present invention may be amphoteric surfactants. The preferred amphoteric surfactants include betaines and sulfobetaines, and sulfated or sulfonated adducts of the condensation products of ethylene oxide and/or propylene oxide with an alkyl amine or diamine. The betaines may be represented by the general formula

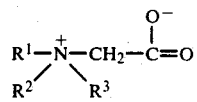
(B)

wherein $R^1$ is an alkyl group containing from about 8 to 20 carbon atoms, and $R^2$ and $R^3$ are alkyl groups containing from 1 to about 4 carbon atoms.

Typical betaines include lauryldimethylammonium betaine and stearyl dimethylammonium betaine. Sulfated and sulfonated adducts include Triton QS-15 (Rohn & Haas Co.), a sulfated adduct of an ethoxylated alkylamine, Miranol HS, a sodium salt of a sulfonated lauric derivative, Miranol OS, a sodium salt of a sulfonated oleic acid, etc.

Cationic surfactants also are useful in the plating baths of the present invention and such surfactants may be selected from the group consisting of higher alkyl amine salts, quaternary ammonium salts, alkyl pyridinium salts and alkyl imidazolium salts.

Cationic surfactants obtained by condensation of various amounts of ethylene oxide or propylene oxide with primary fatty amines are useful and may be represented by the following formula

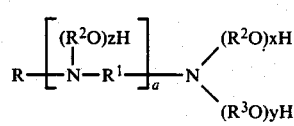
(C)

wherein
R is a fatty acid alkyl group containing from about 8 to about 22 carbon atoms,
$R^1$ is an alkylene radical containing up to about 5 carbon atoms,
$R^2$ and $R^3$ are each independently an ethylene or propylene group,
a is 0 or 1, and
x, y and z are each independently integers from 1 to about 30, and the sum of x, y, and z is an integer of from about 2 to about 50.

More particularly, the alkoxylated amines utilized in the baths of the invention are represented by the formulas D and E

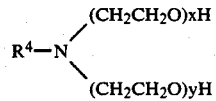
(D)

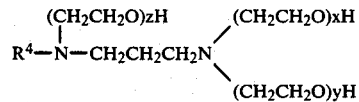
(E)

wherein $R^4$ is a fatty acid alkyl group containing from 12 to 18 carbon atoms, and x, y and z are as defined in formula C.

The above described cationic surfactants are known in the art and are available from a variety of commercial sources. The surfactants of the type represented by formula D can be prepared by condensing various amounts of ethylene oxide with primary fatty amines which may be a single amine or a mixture of amines such as are obtained by the hydrolysis of tallow oils, sperm oils, coconut oils, etc. Specific examples of fatty acid amines containing from 8 to 22 carbon atoms include saturated as well as unsaturated aliphatic amines such as octyl amine, decyl amine, lauryl amine, stearyl amine, oleyl amine, myristyl amine, palmityl amine, dodecyl amine, and octadecyl amine.

The alkoxylated amines which are useful in the plating baths of the invention can be prepared as mentioned above, by condensing alkylene oxides with the above-described primary amines by techniques known to those in the art. A number of such alkoxylated amines is commercially available from a variety of sources.

The above described amines can be prepared, as mentioned above, by condensing alkylene oxides with the above-described primary amines by techniques known to those in the art. A number of such alkoxylated amines is commercially available from a variety of sources. The alkoxylated amines of the type represented by formula D are available from the Armak Chemical Division of Akzona, Inc., Chicago, Ill., under the general trade designation "Ethomeen". Specific examples of such products include "Ethomeen C/15" which is an ethylene oxide condensate of a coconut fatty amine containing about 5 moles of ethylene oxide; "Ethomeen C/20" and "C/25" which also are ethylene oxide condensation products from coconut fatty amine containing about 10 and 15 moles of ethylene oxide respectively; "Ethomeen S/15" and "S/20" which are ethylene oxide condensation products with stearyl amine containing about 5 and 10 moles of ethylene oxide per mole of amine respectively; and "Ethomeen T/15" and "T/25" which are ethylene oxide condensation products of tallow amine containing about 5 and 15 moles of ethylene oxide per mole of amine respectively. Commercially available examples of the alkoxylated amines of the type represented by formula E include "Ethoduomeen I/13" and "T/20" which are ethylene oxide condensation products of N-tallow trimethylene diamine containing about 3 and 10 moles of ethylene oxide per mole of diamine respectively.

Another type of useful cationic surfactant is represented by the formula

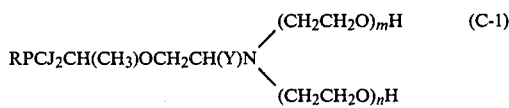
(C-1)

where R is an alkyl group containing from about 8 to about 12 carbon atoms, Y is a methyl or a hydroxyl group, m and n are integers, the sum of which is from about 2 to about 20.

The amine ethoxylate surfactants of the type represented by formula C-1 exhibit the characteristics of both cationic and nonionic surfactants with the nonionic properties increasing at the higher levels of ethoxylation. That is, as the sum of x and y increases, the ethoxylated amine behaves more like a nonionic surfactant.

The surfactants represented by formula C-1 wherein Y is a methyl group are available commercially such as from Texaco Chemical Company under the trade designation "M-300 Series". The M-300 Series compounds currently available from Texaco and which have been found to be useful in the aqueous acid plating baths of the invention include those designated as M-302, M-305, M-310, M-315 and M-320 which contain a total to two five, ten, fifteen and twenty moles of ethylene oxide respectively. In all of these compounds, R is a mixture of 10 and 12 carbon alkyl groups.

The cationic surfactant also may be:

(a) a quaternary ammonium salt of the formula

(F)

wherein X represents a halogen, a hydroxyl group, or the residue of a $C_{1-5}$ alkanesulfonic acid; $R_1$ represents alkyl groupl R' and R" represent a $C_{1-4}$ alkyl group; and R''' represents a $C_{1-10}$ alkyl group or a benzyl group;

(b) pyridinium salts represented by the general formula (G)

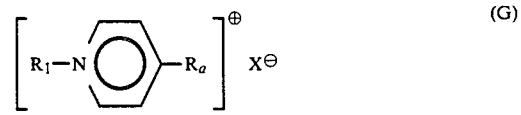
(G)

wherein X represents a halogen, a hydroxyl group, or the residue of a $C_{1-5}$ alkanesulfonic acid; $R_1$ represents a $C_{8-20}$ alkyl group; and $R_a$ represents hydrogen or a $C_{1-4}$ alkyl group;

(c) imidazolinium salts represented by the general formula H

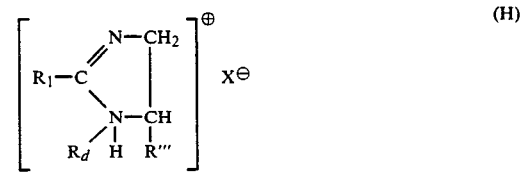
(H)

wherein X represents a halogen, a hydroxyl group, or the residue of a $C_{1-10}$ alkanesulfonic acid; $R_1$ represents a $C_{8-20}$ alkyl group; $R_d$ represents a hydroxy-containing $C_{1-5}$ alkyl group; and R''' represents a $C_{1-10}$ alkyl group or a benzyl group; and (d) higher alkyl amine salts represented by the general formula (I)

$$[R_1-NH_3]^{\oplus} CH_3-(CH_2)_n-COO^{\ominus}$$ (I)

wherein $R_1$ represents a $C_{8-20}$ alkyl group; and n is from about 0 to about 4.

Examples of the above described cationic surfactants, in the form of salts, are lauryltrimethylammonium salt, cetyltrimethylammonium salt, stearyltrimethylammonium salt, lauryldimethylethylammonium salt, octadecyldimethylethylammonium salt, dimethylbenzyllaurylammonium salt, cetyldimethylbenzylammonium salt, octadecyldimethylbenzylammonium salt, trimethylbenzylammonium salt, triethylbenzylammonium salt, hexadecylpyridinium salt, laurylpyridinium salt, dodecylpicolinium salt, 1-hydroxyethyl-1-benzyl-2-laurylimidazolinium salt, 1-hydroxyethyl-1-benzyl-2-oleylimidazolinium salt, stearylamine acetate, laurylamine acetate, and octadecylamine acetate.

The surfactants also may be anionic surfactants. Examples of useful anionic surfactants include sulfated alkyl alcohols, sulfated lower ethoxylated alkyl alcohols, and their salts such as alkali metal salts.

The surfactants described above may be used in the plating baths of the present invention in a concentration of from about 0.01 to about 50 grams per liter of bath and more preferably from about 0.05 to about 20 grams per liter of bath.

Plating baths of the present invention also contain (D) an effective amount of at least one primary brightening agent which is at least one halogen-substituted benzaldehyde or a dialkoxy- or trialkoxy-benzaldehyde such as represented by the following general formula

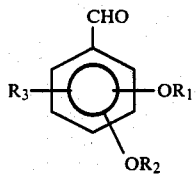

III wherein $R_1$ and $R_2$ are each independently alkyl groups containing from one to about four carbon atoms, and $R_3$ is hydrogen or an alkoxy group containing from one to about four carbon atoms. Examples of the $R_1$ and $R_2$ groups include methyl, ethyl, propyl and isopropyl, and examples of the alkoxy group $R_3$ include methoxy, ethoxy, propoxy, isopropoxy, etc. Preferably the primary brightener is a dialkoxy benzaldehyde, such as the various dimethoxy benzaldehydes. Specific examples of useful substituted benzaldehydes of the type represented by formula III include:
2,3-dimethoxybenzaldehyde
3,4-dimethoxybenzaldehyde
2,4-dimethoxybenzaldehyde
2,5-dimethoxybenzaldehyde
2,6-dimethoxybenzaldehyde
3,5-dimethoxybenzaldehyde
2,3,4-trimethoxybenzaldehyde
2,4,5-trimethoxybenzaldehyde
2,4,6-trimethoxybenzaldehyde
3,4,5-trimethoxybenzaldehyde One or more of the methoxy groups can be replaced by other alkoxy groups such as ethoxy, propoxy and isopropoxy.

Examples of halogen-substituted benzaldehydes useful as primary brighteners (D) include:
o-chlorobenzaldehyde
p-chlorobenzaldehyde
o-bromobenzaldehyde
p-bromobenzaldehyde
2,4-dichlorobenzaldehyde
2,4-dibromobenzaldehyde
2,6-dichlorobenzaldehyde
2,6-dibromobenzaldehyde The preferred compounds are the mono- and dichlorobenzaldehydes, and most preferably, 2,4-dichlorobenzaldehyde.

The primary brightening agents useful in the plating baths and concentrates of the invention may be water soluble adducts of the primary brightening agents described above. For example the bisulfite adducts of the various benzaldehydes are available and/or are easily obtained by procedures known in the art. The use of the water-soluble adduct of the primary brightening agent permits the use of water-based concentrates and eliminates the need for toxic solutions such as alcohol solutions. When added to the acidic plating baths, the adducts decompose to the benzaldehyde. Thus, the plating results are not adversely affected by the use of the adducts.

The amount of the above described primary brightening agents utilized in the plating baths of the present invention can range from about 0.02 to about 5 grams per liter of bath and more generally is within the range of from about 0.05 to about 1 gram per liter of plating bath.

In addition to the primary brightening agent, the plating baths of the present invention also contain (E) an effective amount of a secondary brightening agent which is at least one lower aliphatic aldehyde.

The aliphatic aldehydes which are useful as a secondary brightening agent preferably are lower aliphatic aldehydes containing up to about 6 carbon atoms, and the aliphatic group may be either saturated or unsaturated. Examples of such aldehydes include formaldehyde, acetaldehyde, paraldehyde, butyraldehyde, propionaldehyde, acrolein, crotonaldehyde and 3-hydroxybutanal.

The amount of secondary brightening agent (E) utilized in the plating baths of the present invention may range from about 0.1 to about 20 grams per liter of bath and more generally range from about 0.5 to about 10 grams per liter of the plating bath.

Plating baths of the present invention may also contain (F) an effective amount of at least one auxiliary brightening agent. The compounds used as the auxiliary brightening agents can be generally described as aniline and its ring-substituted derivatives. Suitable substituents on the aniline ring are halogen, amino, carboxy, alkyl and alkoxy groups. The auxiliary brighteners as a class of compounds are represented in formula VI as follows:

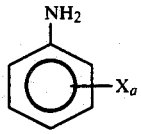

IV wherein X may be hydrogen, halogen, amino, carboxy, alkyl or an alkoxy group or mixtures thereof, and wherein a is an integer from 0 to 3 inclusive.

Mixtures of aniline and/or substituted anilines may also be used as the auxiliary brightening agent.

Examples of useful substituted anilines include:
o-aminoaniline
p-aminoaniline
o-chloroaniline
p-chloroaniline
o-aminobenzoic acid
p-aminobenzoic acid
2-amino-3-methylbenzoic acid
2-amino-5-methylbenzoic acid
4-amino-3-methylbenzoic acid
3-amino-4-methylbenzoic acid
2-chloro-5-methylaniline
3-chloro-4-methylaniline
3,4-diaminobenzoic acid
3,5-diaminobenzoic acid
2,3-dimethylaniline
2,4-dimethylaniline
2,5-dimethylaniline
3,5-dimethylaniline
2,6-diethylaniline
2-methoxy-5-methylaniline 3-methoxy-4-methylaniline
o-toluidine
m-toluidine
p-toluidine
6-ethyl-o-toluidine The preferred auxiliary brighteners are the methyl- and ethyl-substituted anilines, particularly the dimethyl- and diethyl-anilines. The most preferred of these have been found to be 2,4-dimethylaniline (xylidine) and 2,5-dimethylaniline. The preferred to the halogen substituted anilines are the chloroanilines, particularly monochloroaniline and most particularly o-chloroaniline.

The amount of the auxiliary brightening agent (F) utilized in the plating baths of the present invention may range from about 0.02 to about 5 grams per liter of the plating bath and more generally range from about 0.05 to about 1 gram per liter of the plating bath.

Acceptable results are obtained using either the halo-substituted or alkoxy-substituted primary brighteners unaugmentd by an auxiliary brightener. However, results are improved for either primary brightener through use of the above-described auxiliary brighteners (F). This is especially true of the halo-substituted primary brighteners whose performance in a plating bath is much improved by the inclusion of at least one auxiliary brightener in the bath.

Optimal results are obtained using the dialkoxy- and trialkoxybenzaldehydes as primary brightening agents with acetaldehyde as the secondary brightening agent and dimethyl- and trimethyl-amines as the auxiliary brightening agent.

Antioxidants normally used in tin, lead and tin/lead baths may be included in the baths of this invention. For example catechol (1,2-dihydroxybenzene) is useful as an antioxidant stabilizer in the baths and prevents air oxidation of stannous to stannic tin. Generally amounts of from about 0.05 to about 2 grams of antioxidant per liter of bath is sufficient.

The tin, lead, and tin-lead plating baths of the present invention which contain no fluoride and fluoborate ions, and preferably no sulfuric acid, deposit a bright level coating of the metal or alloy on substrates at any conventional temperature used or normally used with tin and/or lead plating baths, and over a wide current density range. The following examples (except for the control examples) illustrate the plating baths of the invention. Unless otherwise indicated in the following examples and elsewhere in the specification and claims, all parts and percentages are by weight, and temperatures are in °C.

EXAMPLE 1

An aqueous plating bath is prepared by mixing the water, sufficient quantities of stannous methane sulfonate to provide 20 g/l of stannous ion, 80 g/l of free methane sulfonic acid, 8 g/l of a nonionic surfactant which is nonylphenol condensed with 10 moles of ethylene oxide, 1 g/l of acetaldehyde, and 0.3 g/l of 2,5-dimethoxybenzaldehyde.

CONTROL 1A

A plating bath is prepared as in Example 1 except that the 2,5-dimethoxybenzaldehyde and acetaldehyde are omitted.

CONTROL 1B

The preparation of Example 1 is repeated except that the acetaldehyde is omitted.

CONTROL 1C

A bath is prepared as in Example 1 except that the 2,5-dimethoxybenzaldehyde is omitted.

The following additional plating baths were prepared following the general procedure of Example 1.

EXAMPLE 2

|  | g/l |
| --- | --- |
| Stannous ion (added as the stannous 2-hydroxypropane sulfonate | 20 |
| Free 2-hydroxypropane sulfonic acid | 90 |
| An ethylene diamine which has been propoxylated followed by condensation with ethylene oxide | 10 |
| Methacrylic Acid | 0.5 |
| 2,4,5-trimethoxybenzaldehyde | 0.3 |
| Water | to make 1 liter |

EXAMPLE 3

| Stannous ion (added as stannous ethane sulfonate) | 18 |
| --- | --- |
| Plumbous ion (added as plumbous ethane sulfonate) | 3 |
| Free ethane sulfonic acid | 100 |
| alpha-naphthol condensed with 12 moles ethylene oxide | 6 |
| Paraldehyde | 15 |
| 2,4-dimethoxybenzaldehyde | 0.3 |
| Water | to make 1 liter |

EXAMPLE 4

|  | g/l |
| --- | --- |
| Divalent tin (added as stannous methane sulfonate) | 18 |
| Divalent lead (added as plumbous methane sulfonate) | 3 |
| Free methane sulfonic acid | 100 |
| Amidox C-5 (ethoxylated fatty acid amide) | 10 |
| Crotonaldehyde | 3 |
| 2,5-dimethoxybenzaldehyde | 0.5 |
| Water | to make 1 liter |

EXAMPLE 5

| Stannous ion (added as stannous hydroxy ethane sulfonate) | 18 |
| --- | --- |
| Plumbous ion (added as plumbous hydroxy ethane sulfonate) | 3 |
| Free hydroxy ethane sulfonate | 120 |
| Surfynol 485 (an ethoxylated tetramethyldecyne diol) | 5 |
| 3,4-dimethoxybenzaldehyde | 0.5 |
| Water | to make 1 liter |

EXAMPLE 6

| Stannous ion (added as stannous methane sulfonate) | 18 |
| --- | --- |
| Plumbous ion (added as plumbous methane sulfonate) | 9 |

| | |
|---|---|
| Free methane sulfonic acid | 80 |
| Texaco M-315 | 4 |
| Acetaldehyde | 2 |
| 2,4-dimethoxybenzaldehyde | 0.3 |
| Water | to make 1 liter |

CONTROL 6A

A bath is prepared as in Example 6 except that the dimethoxybenzaldehyde is replaced with 2-methoxybenzaldehyde

CONTROL 6B

A bath is prepared as in Example 6 except that the dimethoxybenzaldehyde is replaced with 3-methoxybenzaldehyde

EXAMPLE 7

| | g/l |
|---|---|
| Divalent tin (added as stannous hydroxy propylsulfonate) | 18 |
| Divalent lead (added as plumbous hydroxy propylsulfonate) | 9 |
| Free hydroxy propylene sulfonic acid | 80 |
| Pluronic L-44 (an ethylene oxide condensate with a hydrophobic base of polypropylene glycol) | 4 |
| Igepal CO-610 [nonylphenoxypoly-(ethylenoxy)ethanol] | 4 |
| Formaldehyde (added as 37% aq. sol'n) | 10 |
| 2,5-dimethoxybenzaldehyde | 0.5 |
| Water | to make 1 liter |

EXAMPLE 8

| | |
|---|---|
| Divalent tin (as methane sulfonate salt) | 18 |
| Divalent lead (as methane sulfonate salt) | 3 |
| Free methane sulfonic acid | 100 |
| Miranol J2M-SF (amphoteric surfactant from Miranol Chemical Co. identified as a dicarboxylic caprylic derivative, disodium salt, salt free) | 2 |
| 2,4,5-trimethoxybenzaldehyde | 0.15 |
| Water | to make 1 liter |

EXAMPLE 9

| | |
|---|---|
| Divalent lead (as methane sulfonate salt) | 20 |
| Free methane sulfonic acid | 40 |
| Texaco M-315 | 8 |
| Acetaldehyde | 6 |
| 2,5-dimethoxybenzaldehyde | 0.2 |
| Water | to make 1 liter |

EXAMPLE 10

| | g/l |
|---|---|
| Divalent tin (as methane sulfonate salt) | 20 |
| Divalent lead (as methane sulfonate salt) | 2 |
| Free methane sulfonic acid | 80 |
| Ethoxylated beta-naphthol | 8 |
| Acetaldehyde | 4 |
| 2,5-dimethoxybenzaldehyde | 0.2 |
| Water | to make 1 liter |

EXAMPLE 11

| | |
|---|---|
| Divalent tin (as ethane sulfonate salt) | 20 |
| Divalent lead (as ethane sulfonate salt) | 10 |
| Free ethane sulfonic acid | 60 |
| Igepal CO 630 | 8 |
| Acetaldehyde | 4 |
| 2,5-dimethoxybenzaldehyde | 0.25 |
| Water | to make 1 liter |

EXAMPLE 12

| | |
|---|---|
| Stannous ion (as methane sulfonate) | 20 |
| Plumbous ion (as methane sulfonate) | 10 |
| Free methane sulfonic acid | 80 |
| Igepal CO 630 | 6 |
| Acetaldehyde | 8 |
| 2,5-dimethoxybenzaldehyde | 0.5 |
| o-chloroaniline | 0.16 |
| Water | to make 1 liter |

EXAMPLE 13

| | g/l |
|---|---|
| Divalent tin (as methane sulfonate salt) | 20 |
| Divalent lead (as methane sulfonate salt) | 2 |
| Free methane sulfonic acid | 80 |
| Ethoxylated beta-naphthol | 8 |
| Acetaldehyde | 4 |
| 2,5-dimethoxybenzaldehyde | 0.2 |
| 2,5-dimethylaniline | 0.2 |
| Water | to make 1 liter |

EXAMPLE 14

| | |
|---|---|
| Divalent tin (as ethane sulfonate salt) | 20 |
| Divalent lead (as ethane sulfonate salt) | 10 |
| Free ethane sulfonic acid | 60 |
| Igepal CO 630 | 8 |
| Acetaldehyde | 4 |
| 2,5-dimethoxybenzaldehyde | 0.25 |
| 2,4-dimethylaniline | 0.15 |
| Water | to make 1 liter |

EXAMPLE 15

| | |
|---|---|
| Divalent tin (as methane sulfonate salt) | 20 |
| Divalent lead (as methane sulfonate salt) | 2 |
| Texaco M 315 | 8 |
| Acetaldehyde | 8 |
| 2,4-dichlorobenzaldehyde | 0.12 |
| 2,4-dimethylaniline | 0.12 |
| Water | to make 1 liter |

EXAMPLE 16

| | g/l |
|---|---|
| Stannous ion (as methane sulfonate) | 20 |
| Plumbous ion (as methane sulfonate) | 10 |
| Free methane sulfonic acid | 80 |
| Igepal CO 630 | 6 |
| Acetaldehyde | 8 |
| 2,5-dimethoxybenzaldehyde bisulfite | 0.5 |
| o-chloroaniline | 0.16 |
| Water | to make 1 liter |

EXAMPLE 17

| | |
|---|---|
| Stannous ion (added as stannous methane sulfonate | 18 |
| Plumbous ion (added as plumbous methane sulfonate) | 9 |
| Free methane sulfonic acid | 80 |
| Surfonic N 150 | 6 |
| Acetaldehyde | 8 |
| 2,4-dichlorobenzaldehyde | 0.12 |
| 2,4-dimethylaniline | 0.12 |
| Water | to make 1 liter |

EXAMPLE 18

| | |
|---|---|
| Stannous ion (added as stannous methane sulfonate) | 18 |
| Plumbous ion (added as plumbous methane sulfonate) | 9 |
| Free methane sulfonic acid | 80 |
| Texaco M-315 | 4 |
| Acetaldehyde | 4 |
| 2,5-dimethoxybenzaldehyde bisulfite adduct | 0.12 |
| Aniline | 0.16 |
| Water | to make 1 liter |

EXAMPLE 19

| | g/l |
|---|---|
| Divalent tin (as methane sulfonate salt) | 20 |
| Divalent lead (as methane sulfonate salt) | 2 |
| Free methane sulfonic acid | 80 |
| Surfonic N 150 | 4 |
| Acetaldehyde | 4 |
| 2,5-dimethoxybenzaldehyde bisulfite adduct | 0.12 |
| p-chloroaniline | 0.3 |
| Water | to make 1 liter |

The utility of the plating baths of the present invention in depositing tin and tin-lead coatings is demonstrated by conducting plating tests in standard 267 ml Hull cells using as the anode, a tin or tin-lead alloy (60/40, tin/lead). Steel panels are plated at a current of 2 amps for a period of five minutes. Mild mechanical bath agitation is employed, and the bath temperature is maintained at about 20° to about 25° C. The results of the plating tests are summarized in the following Table.

| | | TEST RESULTS |
|---|---|---|
| Example # | Bath | Plating Results on Panel |
| 1 | 100% tin | Clear bright 100 ASF to 10 ASF |
| Control 1A | 100% tin | Matte dull 80 ASF to 2 ASF. Slight burn high current density |
| Control 1B | 100% tin | Burn HCD, hazy bright to 4 ASF |
| Control 1C | 100% tin | Grey matte 100 ASF to 5 ASF. |
| 2 | 100% tin | Semibright 80 ASF to 40 ASF |
| 3 | 80/20 T/L | Hazy bright 60 ASF to 40 ASF |
| 4 | 80/20 T/L | Bright 80 ASF to 40 ASF and hazy bright to 20 ASF |
| 5 | 80/20 T/L | Hazy bright 80 ASF to 40 ASF |
| 6 | 60/40 T/L | Clear bright 100 ASF to 16 ASF |
| 7 | 60/40 T/L | Bright 80 ASF to 50 ASF, and hazy bright 50 ASF to 30 ASF |
| Control 6A | 60/40 T/L | Pitted, bright to 40 ASF, skip plate |
| Control 6B | 60/40 T/L | Pitted, hazy bright 100 ASF to 8 ASF, dull to 0 |
| 8 | 60/40 T/L | Hazy bright 90 ASF to 40 ASF, Matte to 0 |
| 9 | 100% lead | Hazy bright 50 ASF to 20 ASF |
| 10 | 90/10 T/L | Clear bright 100 ASF to 4 ASF |
| 11 | 60/40 T/L | Clear bright 80 ASF to 30 ASF |
| 12 | 60/40 T/L | Bright and very clear high current density - 100 ASF to 60 ASF. At 0.32 g/l o-chloroaniline, clarity extends to 20 ASF |
| 13 | 90/10 T/L | Bright and very clear from 100 ASF to 12 ASF |
| 14 | 60/40 T/L | Bright and very clear from 100 ASF to 30 ASF |
| 15 | 90/10 T/L | Clear bright 100 ASF to 12 ASF |
| 16 | 60/40 T/L | Very clear bright 100 ASF to 16 ASF |
| 17 | 60/40 T/L | Clear bright 100 ASF to 20 ASF |
| 18 | 60/40 T/L | Very clear bright 100 ASF to 12 ASF |
| 19 | 90/10 T/L | Very clear bright 100 ASF to 8 ASF |

The plated deposit approximates the metal composition of the bath but may vary ±5% depending on the current density.

In practice, the improved tin, lead, and tin-lead alloy plating baths containing the brightener compositions of the invention may be operated on a continuous or intermittent basis, and from time to time, components of the bath have to be replenished. The various components may be added singularly as required or may be added in combination. The amounts of the various additive compositions to be added to the plating baths may be varied over a wide range depending on the nature and performance of the plating bath to which the composition is added. Such amounts can be determined readily by one skilled in the art.

As mentioned above, the major advantage of the plating baths of the present invention is that they contain no fluoride or fluoborate ions which eliminates the need for the recovery and disposal of these undesirable ions. The fluoride and fluoborate ions are undesirable because of the environmental pollution problems created on disposal, and further because of their corrosive nature when present in plating baths. The plating baths of the present invention which do not contain fluoride or fluoborate ions are less corrosive to machinery and glass parts, and also permit the use of titanium and titanium alloy anode baskets. It also has been observed that anode dissolution is improved in the plating baths of the present invention which results in less anode polarization and a reduced amount of stannate tin in the bath.

The coatings deposited from the plating baths of the invention are useful in electronic circuits, electronic devices and electrical connectors. The surface layers of tin, lead and tin-lead alloys can be used as protective layers to prevent corrosion or in a patterning procedure during the fabrication of printed circuits or integrated circuits. The coatings also provide chemically stable surfaces for soldering on printed wire boards, etc.

Having best described the invention in full, clear, concise, and exact terms as to enable any person skilled in the art to which it pertains to make and use the invention, and having set forth the best modes contemplated of carrying out the invention, it should be understood that equivalents or substitutions for parts of the above specifically described embodiments of the invention may be made without departing from the scope and concept of the invention.

The embodiments of the invention in which an exclusive property or privilege is claimed are defined as follows:

1. An aqueous tin, lead, or tin-lead alloy electroplating bath free of fluoride and borofluoride ions comprising
   (A) at least one bath-soluble metal salt selected from the group consisting of a stannous salt, a lead salt, or a mixture of stannous and lead salts,
   (B) at least one alkane sulfonic acid or alkanol sulfonic acid,
   (C) at least one surfactant,
   (D) an effective amount of at least one primary brightening agent selected from the group consisting of halo-, dialkoxy- and trialkoxy-substituted benzaldehydes containing from 1 to about four carbon atoms in the alkoxy groups,
   (E) an effective amount of a secondary brightening agent which is at least one lower aliphatic aldehyde, and
   (F) an effective amount of at least one auxiliary brightening agent selected from the group of compounds having the following structural formula:

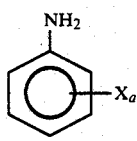

(IV)

wherein X is a hydrogen, halogen, alkyl, lower alkoxy, amino, or carboxyl substituent or a mixture thereof and a is an integer from 0 to 3 inclusive.
2. The plating bath of claim 1 containing as the element (F) an effective amount of an auxiliary brightening agent selected from the group consisting of diethyl, dimethyl, triethyl and trimethyl anilines or a mixture thereof.
3. The plating bath of claim 1 wherein the auxiliary brightening agent is xylidene.
4. The plating bath of claim 1 wherein the concentration of said auxiliary brightening agent is in the range of from about 0.02 to about 5 grams per liter.
5. The method of electrodepositing a bright tin, lead or tin-lead alloy on a substrate which comprises electroplating said substrate in the aqueous acidic plating bath of claim 1.
6. An aqueous tin, lead, or tin-lead alloy electroplating bath free of fluoride and borofluoride ions comprising
   (A) at least one bath-soluble metal salt selected from the group consisting of a stannous salt, a lead salt, or a mixture of stannous and lead salts,
   (B) at least one alkane sulfonic acid or alkanol sulfonic acid,
   (C) at least one surfactant,
   (D) an effective amount of at least one primary brightening agent selected from the group consisting of dialkoxy- and trialkoxy-substituted benzaldehydes containing from one to about four carbon atoms in the alkoxy groups, and
   (E) an effective amount of a secondary brightening agent which is at least one lower aliphatic aldehyde.
7. The plating bath of claim 6 wherein the bath-soluble metal salts (A) comprise the salts of at least one alkane sulfonic acid or alkanol sulfonic acid and mixtures thereof.
8. The plating bath of claim 6 wherein the alkane sulfonic acid and alkanol sulfonic acid are characterized by the following formulae

(I)

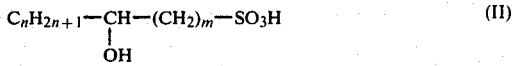

(II)

respectively where R is an aliphatic group containing from 1 to about 12 carbon atoms, n is from 0 to about 10, m is from 1 to about 11, and the sum of m+n is up to about 12.
9. The plating bath of claim 6 wherein the primary brightening agent is a dialkoxybenzaldehyde.
10. The plating bath of claim 6 wherein the primary brightening agent is a dimethoxybenzaldehyde.
11. The plating bath of claim 6 wherein the secondary brightening agent is acetaldehyde.
12. The plating bath of claim 6 also containing an effective amount of an antioxidant.
13. The plating bath of claim 12 wherein the antioxidant is catechol.
14. The method of electrodepositing a bright tin, lead or tin-lead alloy on a substrate which comprises electroplating said substrate in the aqueous acidic plating bath of claim 6.
15. The method of claim 14 wherein the primary brightening agent is a dialkoxybenzaldehyde.
16. An aqueous plating bath for electrodeposition of a tin, lead or tin-lead alloy, which plating bath is free of fluoride and fluoborates and comprises
   (A) from about 0.5 to about 350 grams per liter of at least one stannous ion, lead ion or mixture of stannous and lead ions,
   (B) from about 10 to about 500 grams per liter of at least one alkane sulfonic acid having the general formula

(I)

or an alkanol sulfonic acid of the general formula

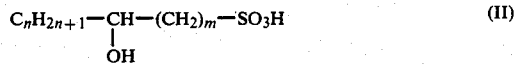

(II)

wherein R is an aliphatic group containing from 1 to about 6 carbon atoms, n is from 0 to about 10, m is from 1 to about 11 and the sum of m+n is up to about 12,
   (C) from about 0.01 to about 50 grams per liter of at least one surfactant,
   (D) an effective amount of at least one primary brightening agent selected from the group consisting of those compounds having the general formula

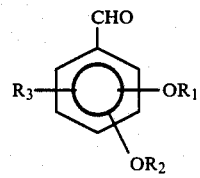

III wherein $R_1$ and $R_2$ are each independently alkyl groups containing from one to about four carbon atoms, and $R_3$ is hydrogen or an alkoxy group containing from one to about four carbon atoms, and (E) an effective amount of a secondary brightening agent which is at least one lower aliphatic aldehyde.

17. The platng bath of claim 16 wherein the primary brightening agent is present in an amount of from about 0.02 to about 5 grams per liter.

18. The plating bath of claim 16 wherein the secondary brightening agent is present in an amount of from about 0.1 to about 20 grams per liter.

19. The plating bath of claim 16 wherein the primary brightening agent is a dialkoxybenzaldehyde.

20. The plating bath of claim 18 wherein the secondary brightening agent is acetaldehyde.

21. The plating bath of claim 16 also containing:

(F) an effective amount of an auxiliary brightening agent selected from the group consisting of diethyl, dimethyl, triethyl and trimethyl anilines, or a mixture thereof.

22. The plating bath of claim 16 also containing;

(F) an effective amount of an auxiliary brightening agent, xylidene.

23. The method of electrodeposition a bright tin, lead or tin-lead alloy on a substrate which comprises electroplating said substrate in the aqueous acidic plating bath of claim 16.

24. An aqueous tin, lead, or tin-lead alloy electroplating bath free of fluoride and borofluoride ions comprising (A) at least one bath-soluble metal salt selected from the group consisting of a stannous salt, a lead salt, or a mixture of stannous and lead salts, (B) at least one alkane sulfonic acid or alkanol sulfonic acid, (C) at least one surfactant, (D) an effective amount of at least one primary brightening agent selected from the group consisting of dialkoxy- and trialkoxy-substituted benzaldehydes containing from one to about four carbon atoms in the alkoxy groups, (E) an effective amount of a secondary brightening agent which is at least one lower aliphatic aldehyde, (F) an effective amount of an auxiliary brigthening agent selected from the group consisting of compounds having the following structural formula:

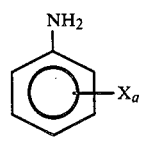

IV wherein X is independently hydrogen, halogen, alkyl, lower alkoxy or carboxyl substituents or a mixture thereof, and a is an integer from 0 to 3 inclusive.

25. The plating bath of claim 24 wherein said auxiliary brightening agent is selected from the group consisting of dimethyl and trimethyl anilines, or a mixture thereof.

26. The plating bath of claim 24 wherein said auxiliary brightening agent is xylidene.

27. The plating bath of claim 24 wherein the total concentration of said auxiliary brightening agent is in the range of from about 0.02 to about 5 grams per liter.

28. The method of electrodepositing a bright tin, lead or tin-lead alloy on a substrate which comprises electroplating said substrate in the aqueous acidic plating bath of claim 24.

29. The method of claim 28 wherein said auxiliary brightening agent is xylidene.

30. An aqueous tin, lead, or tin-lead alloy electroplating bath free of fluoride and borofluoride ions comprising (A) at least one bath-soluble metal salt selected from the group consisting of a stannous salt, and lead salt, or a mixture of stannous and lead salts, (B) at least one alkane sulfonic acid or alkanol sulfonic acid, (C) at least one surfactant, (D) an effective amount of at least one primary brightening agent selected from the group consisting of halo-substituted benzaldehydes, (E) an effective amount of a secondary brightening agent which is at least one lower aliphatic aldehyde, and (F) an effective amount of an auxiliary brightening agent selected from the group consisting of compounds having the following structural formula:

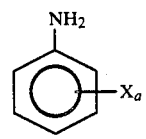

(IV)

wherein X is a hydrogen, halogen, alkyl, lower alkoxy or carboxyl substituent or a mixture thereof, and a is an integer from 0 to 3 inclusive.

31. The plating bath of claim 30 wherein said auxiliary brightening agent is selected from the group consisting of dimethyl and trimethyl anilines, or a mixture thereof.

32. The plating bath of claim 30 wherein said auxiliary brightening agent is xylidene.

33. The plating bath of claim 30 wherein the total concentration of said auxiliary brightening agent is in the range of from about 0.02 to about 5 grams per liter.

34. An aqueous plating bath for electrodeposition of a tin, lead or tin-lead alloy, which plating bath is free of fluoride and fluoborates and comprises (A) from about 0.5 to about 350 grams per liter of at least one stannous ion, lead ion or mixture of stannous and lead ions, (B) from about 10 to about 500 grams per liter of at least one alkane sulfonic acid having the general formula $$RSO_3H \tag{I}$$

or an alkanol sulfonic acid of the general formula $$C_nH_{2n+1}-\underset{OH}{CH}-(CH_2)_m-SO_3H \tag{II}$$

wherein R is an aliphatic group containing from 1 to about 6 carbon atoms, n is from 0 to about 10, m is from 1 to about 11 and the sum of m+N is up to about 12, (C) from about 0.01 to about 50 grams per liter of at least one surfactant, (D) an effective amount of at least one primary brightening agent selected from the group consisting of those compounds having the general formula

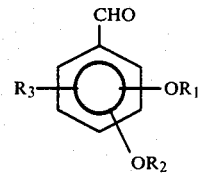

wherein $R_1$ and $R_2$ are each independently alkyl groups containing from one to about four carbon atoms, and $R_3$ is hydrogen or an alkoxy group containing from one to about four carbon atoms, and mono- and dichlorobenzaldehydes, (E) an effective amount of a secondary brightening agent which is at least one lower aliphatic aldehyde, and (F) an effective amount of an auxiliary brightening agent selected from the group consisting of diethyl, dimethyl, triethyl and trimethyl anilines, or a mixture thereof.

35. The plating bath of claim 34 wherein (F) is xylidene.